Figure 1:
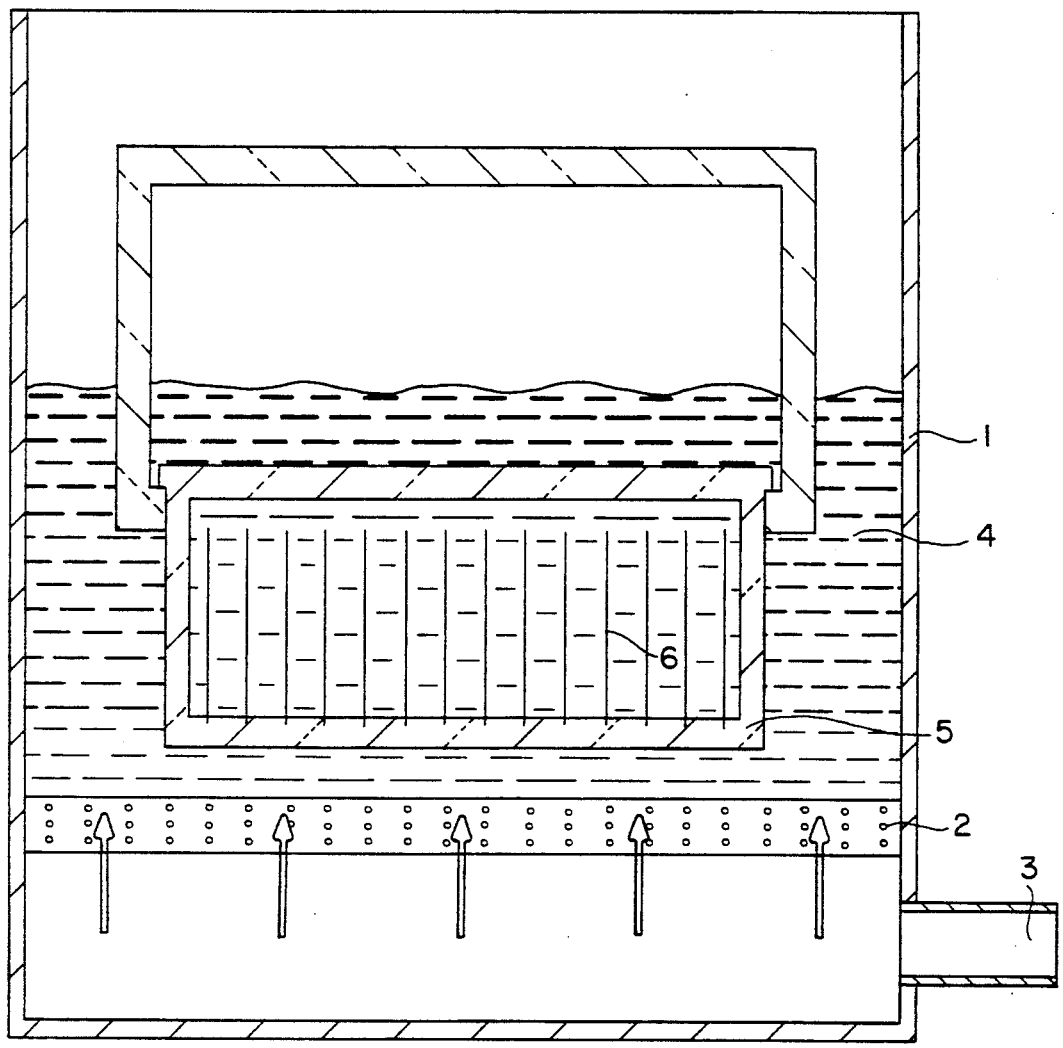
Figure 2:
Figure 3:
Figure 4:
Figure 5:
Figure 6:
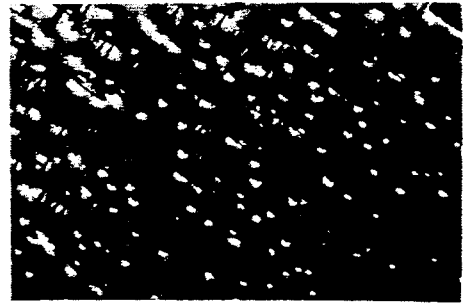

United States Patent [19]

Lampert et al.

[11] Patent Number: 5,133,160
[45] Date of Patent: Jul. 28, 1992

[54] PROCESS FOR THE REMOVAL OF SPECIFIC CRYSTAL STRUCTURES DEFECTS FROM SEMICONDUCTOR DISCS

[75] Inventors: Ingolf Lampert; Reinhold Wahlich, both of Burghausen, Fed. Rep. of Germany

[73] Assignee: Wacker-Chemitronic Gesellschaft fur Elektronik-Grundstoffe m.b.H., Burghausen, Fed. Rep. of Germany

[21] Appl. No.: 680,236

[22] Filed: Dec. 10, 1984

Related U.S. Application Data

[63] Continuation of Ser. No. 400,926, Jul. 22, 1982, abandoned, which is a continuation-in-part of Ser. No. 162,236, Jun. 23, 1980, abandoned.

[30] Foreign Application Priority Data

Jul. 5, 1979 [DE] Fed. Rep. of Germany ....... 2927220

[51] Int. Cl.⁵ ............................................. B24B 31/00
[52] U.S. Cl. .................... 51/317; 51/283 R; 51/328; 51/7; 51/413; 148/240; 72/53; 437/225
[58] Field of Search ............ 51/317, 318, 283 R, 51/328, 6, 7, 17, 413; 148/1.5; 29/576 T; 72/53

[56] References Cited

U.S. PATENT DOCUMENTS

| 3,385,682 | 5/1968 | Lowell . | |
|---|---|---|---|
| 3,573,023 | 3/1971 | Thomas et al. | 72/53 |
| 3,701,696 | 10/1972 | Mets | 148/175 |
| 3,905,162 | 9/1975 | Lawrence et al. | 51/281 SF |
| 4,018,626 | 4/1977 | Schwuttke et al. | 148/1.5 |
| 4,042,419 | 8/1977 | Heinke et al. | 148/1.5 |
| 4,144,099 | 3/1979 | Edmonds et al. | 148/1.5 |
| 4,290,793 | 9/1981 | Brockway | 65/30.1 |

FOREIGN PATENT DOCUMENTS

| 0002205 | 11/1978 | European Pat. Off. . | |
|---|---|---|---|
| 1096502 | 1/1961 | Fed. Rep. of Germany . | |
| 1202171 | 9/1965 | Fed. Rep. of Germany | 51/7 |
| 2059280 | 6/1972 | Fed. Rep. of Germany . | |
| 134092 | 12/1971 | Netherlands . | |
| 311394 | 1/1956 | Switzerland . | |
| 1185555 | 3/1970 | United Kingdom | 51/317 |

*Primary Examiner*—Robert A. Rose
*Attorney, Agent, or Firm*—Collard, Roe & Galgano

[57] ABSTRACT

The invention relates to an improved method for removing point defects and point defect clusters from semiconductor discs, which defects impair the quality of electronic components or structural elements made from such discs. According to the invention, prior to polishing, the semiconductor discs are immersed in a bath containing grains moving in a streaming carrier medium of the bath. One side of the discs are then polished and thereafter the discs are subjected to oxidation processes whereby stacking faults are induced in the rear side of the discs. These stacking faults have an excellent gettering effect on the point defects.

5 Claims, 2 Drawing Sheets

10 SEC. DAMAGE TIME

30 SEC. DAMAGE TIME

40 SEC. DAMAGE TIME

60 SEC. DAMAGE TIME

120 SEC. DAMAGE TIME

PROCESS FOR THE REMOVAL OF SPECIFIC CRYSTAL STRUCTURES DEFECTS FROM SEMICONDUCTOR DISCS

This is a continuation of prior copending application Ser. No. 06/400,926, filed Jul. 22, 1982 (now abandoned), which, in turn, is a continuation-in-part of prior copending application Ser. No. 06/162,236 (now abandoned), filed Jun. 23, 1980.

The present invention relates to a process for the removal of point defects and point defect clusters from semiconductor discs. More particularly, it relates to a process for producing a stacking-faults-inducing destruction of a surface of semiconductor discs.

In the production of electronic components or structural elements, such as for transistors, point defects lead to increased losses in yields. These losses in yields are caused, e.g., in bipolar transistors by leakage currents and in MOS transistors by shortening of the refreshment (regeneration) time.

For instance, according to U.S. Pat. No. 4,042,419, semiconductor discs used for the production of structural elements of this type are provided on one side thereof with a mechanical stress field and thereafter are subjected to a heat treatment. The mechanical stress field is, in this case, produced by incorporating a doping material into the surface of the disc in a quantity which exceeds the maximum solubility in the crystal lattice. It is a prerequisite that the foreign atoms differ in size from the lattice atoms of the semiconductor disc. Another method for providing the mechanical stress field involves producing a defined surface destruction, e.g., by a brief grinding with a suitable lapping agent.

In the subsequent heat treatment of, e.g., silicon discs by tempering at 800–1200° C., the point defects can be removed by suction. As a matter of fact, the point defects, consisting mainly of vacancies or interstitial atoms, are mobile at the high temperatures and are drawn or sucked out of the semiconductor discs by the stress field acting on the one side of the disc, which field is due to the unilateral (i.e., one side) surface destruction or to the unilaterally-formed dislocation network, resulting from the doping.

The gettering, unilateral surface destruction can also be obtained by sand blasting one side of the disc or by a planned, uniform scratching of one side, e.g., with a stencil or with a material harder than the disc (compare U.S. Pat. No. 3,905,162). However, it is a shortcoming of the mentioned process that the rear side of the disc frequently exhibits such massive destruction — see U.S. Pat. No. 3,905,162, scratches of, e.g., 5 $\mu$m in depth — that the surface destruction may break through to the front side. Furthermore, with several oxidation steps the destroyed rear side may be used up by oxidation so that it will lose its gettering effect after some time.

It is therefore the object of the present invention to provide a process for obtaining semiconductor discs, which lend themselves to lasting removal of point defects and point defect clusters even when undergoing a number of oxidation processes.

This is accomplished, according to the invention, by submerging the discs into a bath of a streaming carrier medium containing moving grains.

As grains, substances are generally suitable, which are of equal or greater hardness than the semiconductor disc to be treated. For example, for silicon discs, grains consisting of silicon, silicon carbide, diamond, zirconium dioxide, aluminum oxide or, preferably, quartz are suitable. Quartz is preferred for use with silicon discs, because grains which may adhere to the disc after submersion, are completely absorbed in hydrofluoric acid in the subsequent purification process and, consequently, cannot be taken along into the polishing machine.

The grain size is in the range of 50–1000 $\mu$m. Preferably, the grain size is in the range from 100–400 $\mu$m.

As a carrier medium, a liquid may be used, e.g., a liquid which may be made turbulent, such as water or other liquids inert to semiconductor discs. The turbulence is brought about by circulation through pumps or by means of appropriate stirrers.

A preferred form for the carrier medium are gases, e.g., argon, nitrogen, or gaseous mixtures, especially air. Another preferred carrier medium is a fluidized bath consisting of solid materials and gas, such as used for metal cleaning, and which is commercially available.

The mechanism for the stacking fault inducing effect obtained by the present process is not clear. Initially, comparatively coarse grains were used in the fluidized bed which, apparently, acted as "grinding" grains, caused the formation of microscratches, which were believed responsible for the stacking fault inducing effect of the fluidized bed treatment. Meanwhile, comparatively finer grains were used which did not cause any visible change of the wafer surface, even when inspected by an electron microscope. Moreover, even the weight of the wafers after the treatment was exactly the same as before, thus tending to indicate that no abrasion takes place. Nevertheless, there is the same stacking fault inducing effect as in the coarse grain treatment. This means that this effect cannot be substantially correlated to the creation of scratches.

The only certain fact is that the fluidized bed treatment creates nuclei for the stacking faults which can be found up to a depth of 0.03–0.04 $\mu$m (of course, the stacking faults originated from these nuclei range much deeper). Perhaps, the effect is caused by surface defects in about the same order of magnitude (width $\approx$ depth $\approx 0.03$ $\mu$m, length $> 0.03$ $\mu$m), which corresponds to about 50 atomic layers. However, it should be emphasized that although the mechanism is not understood, all the measures necessary to induce stacking faults in semiconductor discs are disclosed herein.

Other objects and features of the present invention will become apparent from the following detailed description when taken in connection with the accompanying drawings which disclose one embodiment of the invention. It is to be understood that the drawings are designed for the purpose of illustration only, and are not intended as a definition of the limits of the invention.

In the drawings:

FIG. 1 is a schematic representation of a bath consisting of a gas and solid material, in which semiconductor discs are submerged; and FIGS. 2–6 are micro-photographs showing the gettering stacking faults after oxidation, following a submersion time of the discs in the gas-solid bath of 10, 30, 40, 60 and 120 seconds, respectively.

Referring to FIG. 1, the bath basically consists of a chamber 1 having an open top, made of, e.g., aluminum, steel, or also of plastic. Into the bottom of chamber 1 there is fitted a gas-permeable bottom plate 2, for instance, a fine-pored filter plate or a glass- or quartz frit. Through plate 2, a gas (e.g., compressed air) is introduced via an inlet 3 into chamber 1 which whirls up a filling 4 of solid particles lying on gas-permeable plate 2; the individual solid particles are floating, microscopically separated by the streaming gas. This condition, which is also called "fluidization", imparts to the gas-solid bath the properties of a liquid. For instance, the fluidized bath can be moved and it blows bubbles; it always looks for its specific level. Particles having a lower specific weight than that of the bath, rise to the surface, while particles of higher weight, sink down. Subsequently, a processing hurdle or tray 5 is immersed into bath 4, the tray containing lapped semiconductor discs 6 which have previously been treated in an etching bath, followed by a drying process.

The dwell time is about 10–300 seconds and is substantially dependent on the grain size of the filling and the turbulence, i.e., the rate of flow gas per unit of space.

The rate of gas flow is itself dependent on the size of the grain of the fill to say, there has to be so much air admitted that the solid particles lying on the frit will be evenly lifted and uniformly or homogeneously streamed through over the whole area. The depth of the bath, on the other hand, is also dependent on the amount of particles filled in and should be at least sufficient to allow for complete submergence of the tray with the semiconductor discs.

The dwell time in any individual case is so adjusted that the stacking fault concentration is so dense and covers the surface of the disc to an extent that it effects every element of volume of the discs, which are usually 200–400 $\mu$m thick, a point defect gettering effect. With a silicon disc of a thickness of about 400 $\mu$m, a stacking fault density of about $10^4$ per $cm^2$ is sufficient. Stacking faults may be made visible after the oxidation of the discs by secco-etching (2 parts by vol. of 40% aqueous hydrofluoric acid and 1 vol. part of 0.15 molar, aqueous potassium bichromate solution) and they can then be counted under the microscope.

By the blowing-in of gases, e.g., nitrogen, argon, or especially air, the "density" of the filling, consisting of aluminum oxide, silicon carbide or, e.g., quartz grains, can be reduced to an extent that the semiconductor discs, e.g., silicon discs, can be easily submerged. Frit 2 serves to provide a homogeneous gas distribution, so that the dense packing of the grains is considerably loosened, thereby allowing the individual grains to begin to float upon the gas cushion, as a result of which a liquid-like condition is obtained. The whirling grains are moved steadily along the surface of the rows of semiconductor discs in the processing tray 5 where they may, depending on the size of the grains, produce a large number of very fine scratches, in the range clearly below 1 $\mu$m and most of the time about 0.1 $\mu$m. This fluidized bed treatment causes, by the subsequent oxidation in the manufacture of the structural elements, the inducement of stacking faults, which have an exceedingly strong gettering effect on point defects of all kinds.

After the discs have been taken out of the bath, they are freed of adhering grains, e.g., by a brief immersion in an ultrasonic bath, and are then washed in a liquid; for instance, in the case of silicon discs, by immersion in about 10% aqueous hydrofluoric acid, in which the preferably used quartz grains easily dissolve without residue. Subsequently, the semiconductor discs are polished, which advantageously results in the discs, treated according to the invention, being destroyed superficially on all sides, which makes a directed application superfluous, contrary to the procedures of the state of the art.

By the polishing process the micro scratches, if any, on the disc surface are quantitively removed. In the subsequent oxidation steps at temperatures of about 900–1230° C., the described stacking faults will form and will be capable of effecting their exceedingly strong gettering properties on the point defects.

The stacking faults on the rear side of the discs are very stable and do not lose their effectiveness even after numerous oxidation steps within the indicated temperature range. The length of the oxidation-conditioned stacking faults varies with the crystal orientation and lies mostly in the magnitude of 3–8 $\mu$m in [111] oriented discs, but they can increase by oxidation to 30 $\mu$m in [100] oriented discs. However, there is no risk of breaking through the discs which are of a thickness of 200–400 $\mu$m. After oxidation, the semiconductor discs are positively free of point defects or point defect clusters.

In the following, the invention will be described by a number of examples, but it should be understood that these are given by way of illustration only and not of limitation.

EXAMPLE 1

Into a 120×180 mm metal container of the type shown in FIG. 1, having a height of 300 mm, in which was fitted a quartz frit of 5 mm thickness, suspended 30 mm above its bottom surface, aluminum oxide powder with a grain size of 300±50 $\mu$m was filled to a height of about 100 mm. Subsequently, compressed air at a pressure of about 5 bar was blown through the filter plate and the supernatant solid filling. Into the fluidized, whirled solid bath a processing tray was then immersed having arranged therein 25 lapped and etched discs of 75 mm diameter; the discs were of the p-conductivity type and [100] oriented; after 10 seconds they were withdrawn from the bath.

The test was repeated thereafter with dwell times of 30 sec., 40 sec., 60 sec., and 120 sec.

Each silicon disc was then oxidized for about 120 min. at 1100° C. in an oxygen current and secco-etched. As may be seen from FIGS. 2–6, which show the stacking fault density at 160× magnification, the number of point defect-gettering stacking faults increases linearly with the dwell time of the discs in the bath with moving grains, the distribution over the disc surface being extraordinarily uniform.

As shown in FIGS. 2–6, the stacking faults obtained were clearly visible under the microscope at 160× magnification, their length being 25–30 $\mu$m.

EXAMPLE 2

Into the solid bath described in Example 1, a processing tray with 25 lapped and etched silicon discs of p-conductivity type but [111] orientation, and of 75 mm diameter, were immersed for 120 sec.; the solid filling being in this case fine quartz sand of a grain size 300±50 $\mu$m.

One side of the discs was polished and exposed to about 2 hours of oxidation in a humid oxygen current and then secco-etched, whereupon the stacking faults were counted under a microscope. The density of the stacking faults was 1.5×$10^4$ per $cm^2$ which was about one order of magnitude below the [100] oriented p-material of Example 1 when treated in the same manner. Furthermore, the growth in length of the stacking faults was 8-12 μm, which was considerably lower. Point defects were quantitatively drawn off during the oxidation by the stacking fault-covered rear side of the discs.

EXAMPLE 3

The procedure was the same as in Example 2, with the difference being that the discs polished on one side were subsequently oxidized with a dry oxygen current at 920° C. In this case as well, all point defects and point defect clusters were drawn off by the stacking fault-covered rear side of the discs.

EXAMPLE 4

The procedure was the same as in Example 2, the difference being that the dwell time in the bath was increased to 150 sec., and in the oxidation step 1 vol. of chlorine was mixed with the oxygen. The lengths of the stacking faults were obviously reduced by the chlorine admixture to 4-6 μm, but in this case as well, point defect removal was complete.

EXAMPLE 5

The procedure was again the same as in Example 2, but the discs, polished on one side, are subjected subsequently to six oxidation steps and after each step the oxide formed was removed by etching and the discs were then cleaned.

The suctioning of drawing off effect on the "haze", that is to say on the point defect clusters, remained active after each of the process steps.

Thus, while only several examples of the present invention have been shown and described, it will be obvious that many changes and modifications may be made thereunto, without departing from the spirit and scope of the invention.

What is claimed is:

1. A process for manufacture of semiconductor wafers having one side in which stacking faults having a gettering effect on point defects are formed during subsequent oxidation, comprising the steps of:

pretreating the wafers by arranging said wafers in a processing tray and immersing said tray of wafers in a bath of grains fluidized by a streaming carrier medium disposed in a container;

withdrawing the wafers from the bath and said container; and thereafter polishing one side of said wafers to free the same from the effect mechanical stress.

2. The process according to claim 1, wherein the grains have a size of 100-400 μm.

3. The process according to claim 1, wherein the carrier medium is compressed air.

4. The process according to claim 1, wherein said wafers have a thickness between 200-400 μm.

5. The process of claim 1, wherein said pretreating step comprises immersing the wafers in a fluidized, whirled, turbulent gas-solid bath.

* * * * *